(12) United States Patent
Laufer et al.

(10) Patent No.: US 8,133,814 B1
(45) Date of Patent: Mar. 13, 2012

(54) ETCH METHODS FOR SEMICONDUCTOR DEVICE FABRICATION

(75) Inventors: Steffen Laufer, Dresden (DE); Gunter Grasshoff, Radebeul (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 12/959,943

(22) Filed: Dec. 3, 2010

(51) Int. Cl.
*H01L 21/461* (2006.01)
*H01L 21/302* (2006.01)

(52) U.S. Cl. ........ 438/689; 438/714; 438/719; 438/723; 438/734; 438/738; 257/E21.196; 257/E21.252; 257/E21.312

(58) Field of Classification Search ........... 257/E21.196, 257/E21.252, E21.312
See application file for complete search history.

(56) References Cited

U.S. PATENT DOCUMENTS

| 5,962,885 A * | 10/1999 | Fischer et al. ............... 257/306 |
| 6,686,295 B2 * | 2/2004 | Langley ...................... 438/714 |
| 2006/0163675 A1 * | 7/2006 | Hokazono ................... 257/407 |

* cited by examiner

*Primary Examiner* — Mohsen Ahmadi
(74) *Attorney, Agent, or Firm* — Ingrassia Fisher & Lorenz, P.C.

(57) ABSTRACT

Methods are provided for fabricating a semiconductor device. One embodiment includes forming an insulator layer overlying a semiconductor substrate and depositing a layer of polycrystalline silicon overlying the insulator layer. Conductivity determining impurity ions are implanted into at least an upper portion of the layer of polycrystalline silicon. At least the upper portion of the layer of polycrystalline silicon is etched using a first anisotropic etch chemistry to expose an edge portion of the upper portion. An oxide barrier is formed on the edge portion and a further portion of the layer of polycrystalline silicon is etched using the first anisotropic etch chemistry. Then a final portion of the layer of polycrystalline silicon is etched using a second anisotropic etch chemistry.

12 Claims, 4 Drawing Sheets

ETCH METHODS FOR SEMICONDUCTOR DEVICE FABRICATION

TECHNICAL FIELD

The present invention generally relates to semiconductor device fabrication, and more specifically relates to methods for etching a polycrystalline or amorphous component of a semiconductor device.

BACKGROUND

The trend in designing and fabricating semiconductor integrated circuits is to incorporate more and more individual devices in each integrated circuit. This trend requires such individual devices, and hence the components making up those devices, to be reduced to ever smaller and smaller size. Although the device size is reduced, the concomitant goal is to maintain device performance. This goal requires changes in device fabrication. For example, either polycrystalline or amorphous silicon is often used in the fabrication of semiconductor devices, such as for forming gate electrodes and other device components. Although there is an obvious difference in the crystalline nature of the polycrystalline silicon and amorphous silicon, for convenience herein the term "polycrystalline" will hereinafter be used to mean either polycrystalline or amorphous as the two materials behave in a similar manner in the context of the instant invention. To maintain the requisite conductivity of a polycrystalline silicon gate electrode, interconnect, or other device component, the impurity doping level in the polycrystalline material must be increased. Increasing the impurity doping level in polycrystalline silicon, however, leads to problems with acceptable photolithographic patterning and etching of the polycrystalline component. This problem is exacerbated by the need for ever smaller device and component size. Consider a gate electrode of an MOS transistor as an example. The size of the gate electrode must be reduced, which requires the impurity doping level in the electrode to be increased to maintain adequate conductivity. The increased impurity doping level causes problems in etching the electrode, but the reduced electrode size imposes severe requirements on maintaining electrode size and profile.

Accordingly, it is desirable to provide improved methods for fabricating semiconductor devices including methods for etching impurity doped polycrystalline silicon. Furthermore, other desirable features and characteristics of the present invention will become apparent from the subsequent detailed description and the appended claims, taken in conjunction with the accompanying drawings and the foregoing technical field and background.

BRIEF SUMMARY

In accordance with one embodiment a method is provided for fabricating a semiconductor device that includes forming an insulator layer overlying a semiconductor substrate and depositing a layer of polycrystalline silicon overlying the insulator layer. Conductivity determining impurity ions are implanted into at least an upper portion of the layer of polycrystalline silicon. At least the upper portion of the layer of polycrystalline silicon is etched using a first anisotropic etch chemistry to expose an edge portion of the upper portion. An oxide barrier is formed on the edge portion and a further portion of the layer of polycrystalline silicon is etched using the first anisotropic etch chemistry. Then a final portion of the layer of polycrystalline silicon is etched using a second anisotropic etch chemistry.

In accordance with another embodiment a further method is provided for fabricating a semiconductor device that includes forming an oxide layer overlying a semiconductor substrate and depositing a layer of polycrystalline silicon overlying the oxide layer, the layer of polycrystalline silicon having a lightly doped region and an overlying heavily doped region. The method continues by anisotropically etching through the heavily doped region using a non-selective etch chemistry to expose an edge portion of the heavily doped region and a portion of the lightly doped region. A passivating layer is formed on the edge portion of the heavily doped region and on the portion of the lightly doped region. An anisotropic etchant is used to etch through the passivating layer on the portion of the lightly doped region using a non-selective etch chemistry and the lightly doped region is etched using a selective anisotropic etch chemistry.

In accordance with yet another embodiment a method for fabricating a semiconductor device includes forming a gate insulator layer overlying a semiconductor substrate and depositing a layer of polycrystalline silicon overlying the gate insulator layer. Conductivity determining ions are implanted into at least an upper portion of the layer of polycrystalline silicon. A patterned masking layer is formed overlying the layer of polycrystalline silicon and at least the upper portion of the layer of polycrystalline silicon is reactive ion etched using a non-selective etch chemistry using the patterned masking layer as an etch mask and leaving an unetched portion of the layer of polycrystalline silicon. The unetched portion of the layer of polycrystalline silicon is subjected to an oxygen plasma to form an oxide surface layer on the unetched portion. A non-selective etch chemistry is used to reactive ion etch the oxide surface layer and a further portion of the layer of polycrystalline silicon to leave a remaining portion of the layer of polycrystalline silicon. The remaining portion of the layer of polycrystalline silicon is reactive ion etched using a selective etch chemistry to stop on the gate insulator layer to form a gate electrode. Conductivity determining ions are then implanted into the semiconductor substrate to form source and drain regions in alignment with the gate electrode.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

FIGS. 1-6 illustrate, in cross section, methods for forming a semiconductor device 100 in accordance with various embodiments of the invention. For illustrative purposes only, device 100 is depicted as an MOS transistor, and the focus of the description of embodiments is on a gate electrode structure 130 of the transistor. The invention is not limited to MOS transistors or to gate electrodes, but rather can be applied to the fabrication of any semiconductor device that employs a polycrystalline silicon device element such as a gate electrode, a conductive interconnect, or the like. Again, as stated above, the term "polycrystalline" is used herein, including in the claims, to mean both polycrystalline or amorphous. Various steps in the fabrication of semiconductor devices are well known and so, in the interest of brevity, many conventional steps will only be mentioned briefly herein or will be omitted entirely without providing the well known process details.

Figure 1:
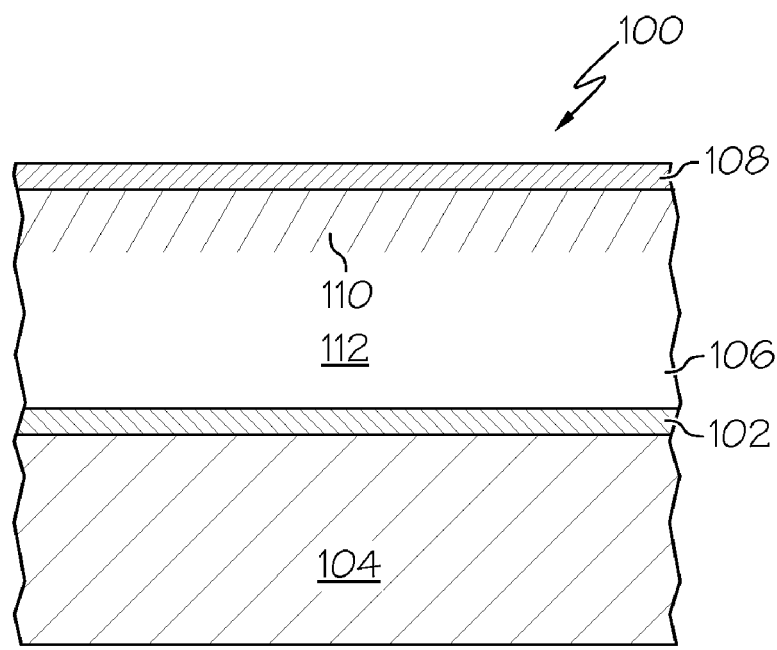
FIGS. 1-6 illustrate, in cross section, a semiconductor device and method steps for its fabrication.

As illustrated in FIG. 1, the method begins by forming an insulating layer 102 overlying a semiconductor substrate 104. Although insulating layer 102 can have any thickness, as a specific example the insulating layer can be, for example, a gate oxide layer having a thickness of say 1-2 nanometers (nm). The insulating layer can be a layer of thermally grown silicon dioxide, a silicon oxide admixed with nitrogen or other elements, or other insulating material commonly used in the fabrication of semiconductor devices. Additionally, the insulating layer can be a composite structure including an oxide layer and an overlying layer of high dielectric constant material (a high-k dielectric) such as an oxide of hafnium. Semiconductor substrate 104 can be silicon, silicon admixed with germanium, or any other semiconductor material commonly used in the semiconductor industry. A layer of polycrystalline silicon 106 is deposited overlying insulating layer 102. The layer of polycrystalline silicon can have any thickness as required by the specification of the device being fabricated, but as an example, for a gate electrode of an MOS transistor, can have a thickness of about 70-100 nm. The layer of polycrystalline silicon is usually deposited by chemical vapor deposition or evaporation as either an undoped layer or as a lightly impurity doped layer. A layer of hard mask material 108 such as an oxide or a nitride is deposited overlying the layer of polycrystalline silicon. To raise the conductivity of polycrystalline silicon layer 106, conductivity determining ions are implanted into at least the upper portion of the layer to form a heavily doped region. For the gate electrode of an n-channel MOS transistor, for example, phosphorus or arsenic ions are implanted into the polycrystalline silicon at an implant dose of up to about $1 \times 10^{15}$ cm$^{-2}$. Similarly, for a p-channel MOS transistor the polycrystalline silicon is implanted with boron ions. The heavily doped impurity region of polycrystalline silicon layer 106 is illustrated by the cross hatched area 110. As used herein the term "heavily doped region" shall mean a region having an implant dose of impurity ions of greater than about $1 \times 10^{-14}$ cm$^{-2}$ or a region having an equivalent impurity doping regardless of the manner in which the impurity dopant is introduced into the polycrystalline silicon The region below heavily doped region 110, region 112, remains undoped or lightly doped and will be hereinafter referred to as the lightly doped region. The implantation can be done either before or after the deposition of the layer of hard mask material 108. Although not illustrated, a layer of metal may also be deposited between the layer of insulator and the layer of polycrystalline silicon, for example in the fabrication of a metal gate MOS transistor.

Although only a single polycrystalline silicon feature is illustrated, those of skill in the art will understand that a semiconductor device, especially an integrated circuit device may contain a large number of such features. If the device is a CMOS integrated circuit, the gate structures of n-channel transistors and p-channel transistors would be implanted separately with appropriate implant masking such as with a patterned layer of photoresist to mask the areas not intended for implantation.

Once polycrystalline silicon layer 106 is deposited overlying insulator layer 102, the objective is to pattern the polycrystalline silicon to form a gate electrode 130 or other polycrystalline silicon feature having a well defined and well controlled size and straight walled vertical profile. In applications in which the polycrystalline silicon is not heavily doped this can be accomplished with conventional processing. The hard mask layer is patterned to serve as a patterned etch mask and the polycrystalline silicon is first etched with a non-selective anisotropic etchant and then with a selective anisotropic etchant. By non-selective etchant is meant in this context an etchant that etches polycrystalline silicon and insulator at substantially similar rates. By selective etchant is meant, in this context, an etchant that etches polycrystalline silicon at a significantly higher etch rate than the insulator. The initial etching is done using a non-selective etchant because the etching proceeds rapidly and controllably. By using a selective etchant to finish the etch process, the remaining polycrystalline silicon can be etched through to the underlying insulator layer and the etching stops at the insulator layer without substantially etching the insulator. In contrast, if a non-selective etchant is used to complete the etching of the polycrystalline silicon, the etchant may also etch the insulating layer and may etch the insulator layer underlying the polycrystalline silicon feature. Etching the insulating layer underlying the polycrystalline silicon feature can cause device failure.

Figure 7:
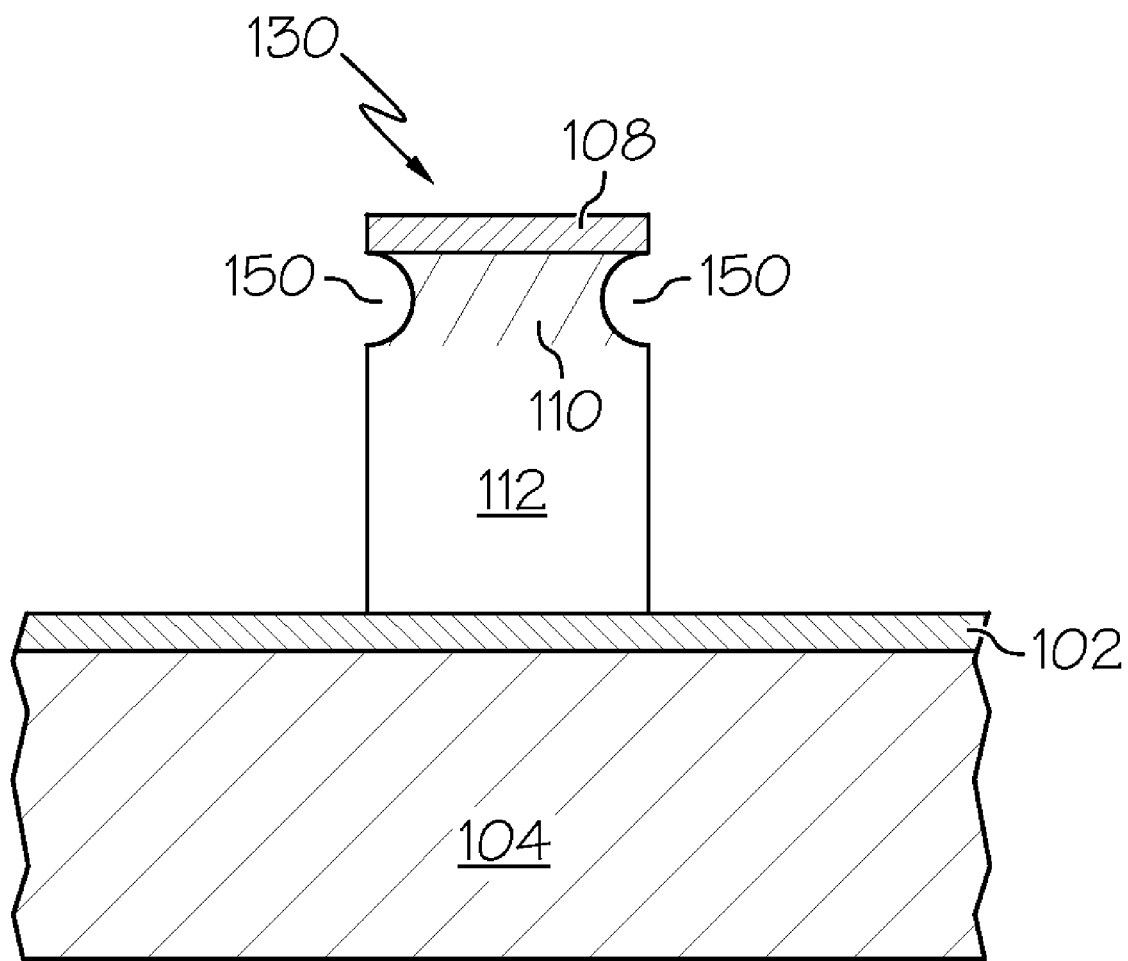
FIG. 7 illustrates, in cross section, problems overcome by the present embodiments.

The foregoing etch process cannot be reliably applied, however, if the polycrystalline silicon includes a heavily doped region such as region 110 because the selective etchant has a higher etch rate for heavily doped polycrystalline silicon than for lightly doped polycrystalline silicon and thus adversely attacks the heavily doped polycrystalline silicon and etches a lateral recess 150 into the heavily doped region as illustrated in FIG. 7. The desired straight walled vertical profile of the polycrystalline silicon feature cannot be maintained with the conventional processing if the polycrystalline silicon includes a heavily doped region.

Figure 2:
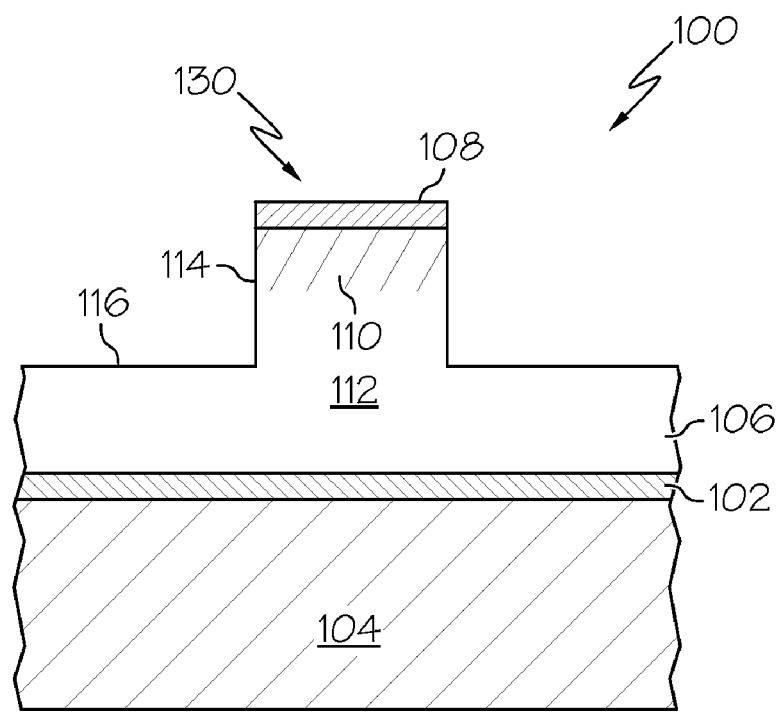

To overcome the problem illustrated in FIG. 7, the method in accordance with embodiments of the invention continues as illustrated in FIG. 2. Using hard mask layer 108 as a patterned masking layer, polycrystalline silicon 106 is etched to a depth extending at least thorough the upper portion of the polycrystalline silicon, that is, through the thickness of heavily doped region 110. This etching step is accomplished using a non-selective anisotropic etch process. The anisotropic etch process can be, for example, a reactive ion etch (RIE) process employing a non-selective etch chemistry such as a $CF_4$ etch chemistry. Such an etch chemistry is well known and need not be explained in detail. The etch step exposes an unetched edge portion 114 of the polycrystalline silicon including a portion of the polycrystalline silicon that is heavily impurity doped. The etch step also exposes an unetched horizontal portion 116 of the lightly doped polycrystalline silicon.

Figure 3:
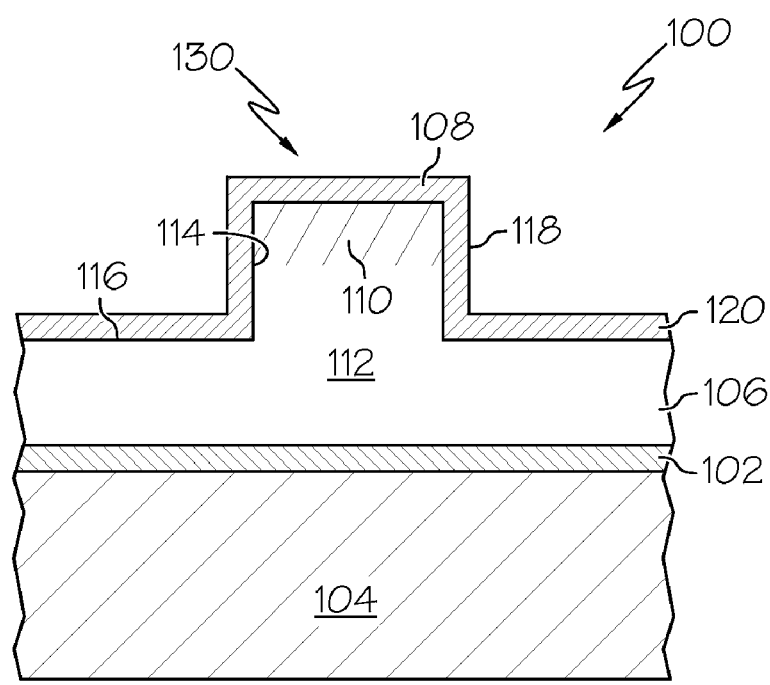
Figure 4:
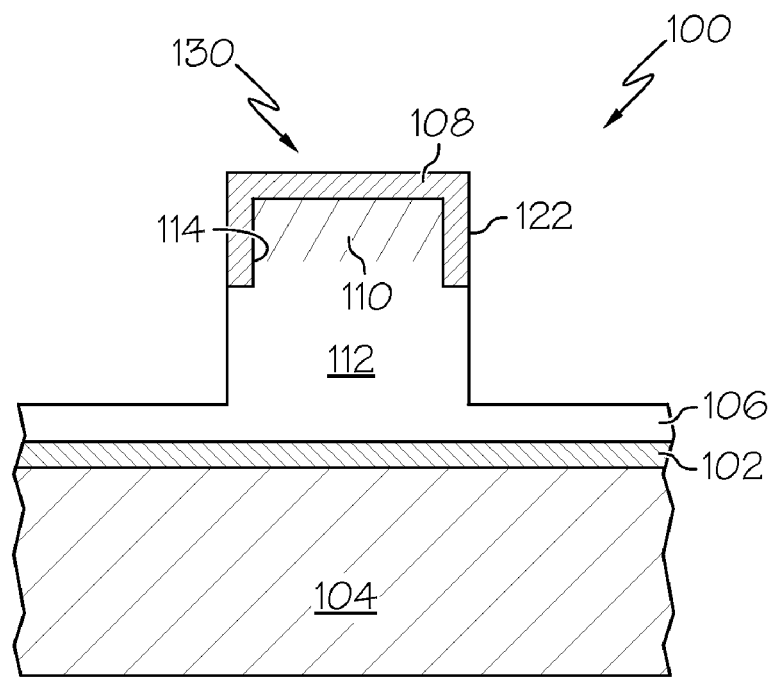

As illustrated in FIG. 3, the method continues by forming an oxide barrier layer 118 on the edge portion 114 and an oxide barrier layer 120 on horizontal portion 116. The oxide barrier can be formed by exposing device 100, including the edge and horizontal portions, to an isotropic oxygen plasma. As an example, the non-selective RIE can be terminated, the reactants flushed from the RIE chamber, and the chamber flooded with an unbiased oxygen plasma for a period of 10-20 seconds to form the oxide barrier.

The method continues as illustrated in FIG. 4 by again subjecting device 100 to a non-selective anisotropic etch to etch through oxide barrier layer 120 on horizontal portion 116 and to continue the etching of polycrystalline silicon 106 and specifically a portion of the lightly doped region 112. The non-selective anisotropic etch can be the same as the previous non-selective anisotropic etch chemistry, namely a RIE etch using a $CF_4$ chemistry, although other non-selective etch chemistries can also be used. The anisotropic nature of this etch removes oxide barrier 120 from the horizontal portions of the polycrystalline silicon while leaving oxide barrier 118 substantially unetched on edge portion 114 resulting in the formation of a protective sidewall barrier 122 masking edge portion 114.

Figure 5:
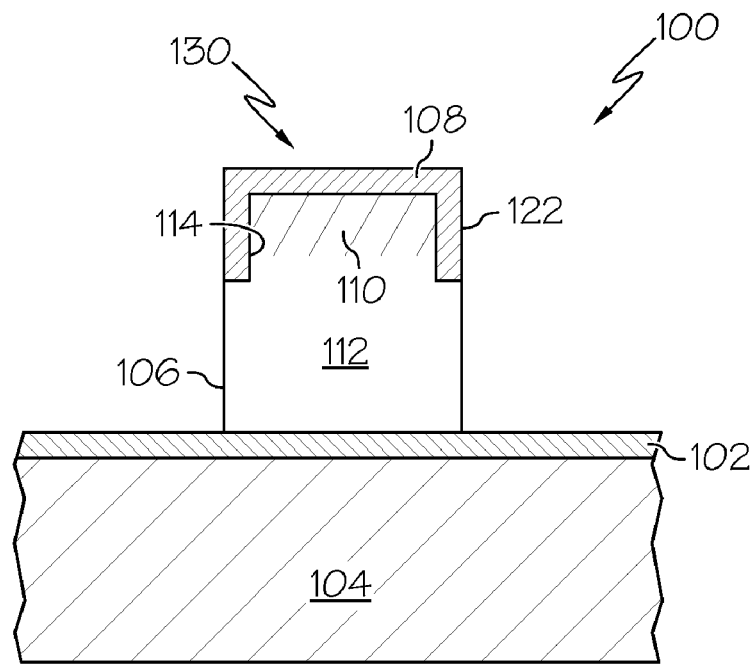

The etching of gate electrode 130 is completed by etching through the remainder of lightly doped region 112 of polycrystalline silicon 106 and stopping on gate insulator 102 using a selective anisotropic etch chemistry as illustrated in FIG. 5. This etch step can be carried out using a halogen chemistry in a RIE etch process. For example, the etching can use a hydrogen bromide (HBr) and oxygen chemistry. Such a RIE chemistry is well known and need not be described in detail. During the selective anisotropic etching of lightly doped region 112 of polycrystalline silicon 106 protective oxide sidewall barrier 122 prevents the unwanted etching of heavily doped region 110 because of the selective nature of the etch chemistry employed. The selective nature of the selected etch chemistry also avoids undesired etching of the gate oxide at the edge of gate electrode 130 and the straight walled profile of the gate electrode is preserved. Masking layer 108 and sidewall barriers 122 can then be removed.

Figure 6:
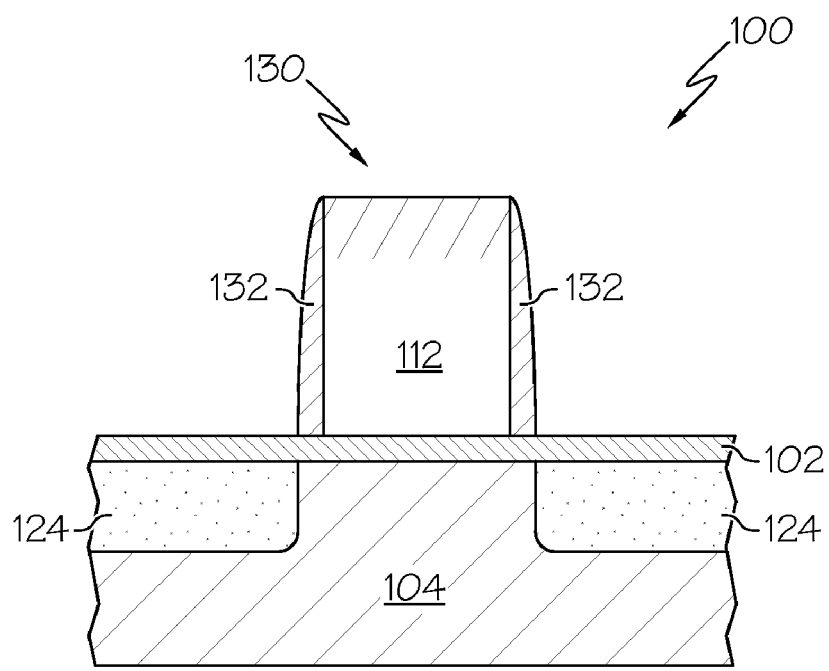

The processing of exemplary semiconductor device 100 proceeds by forming source and drain regions 124 in semiconductor substrate 104 spaced apart and aligned with gate electrode 130 as illustrated in FIG. 6. Intermediate steps such as the formation of sidewall spacers 132 are well known in the art and need not be explained. Similarly, back end of line processing steps such as the formation of electrical contacts to the source and drain regions and the gate electrode, intermetal dielectric layers, interconnect layers, and the like need not be illustrated or explained.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the invention in any way. Rather, the foregoing detailed description will provide those skilled in the art with a convenient road map for implementing the exemplary embodiments. It should be understood that various changes can be made in the specifically enumerated process steps without departing from the scope of the invention as set forth in the appended claims and the legal equivalents thereof. For example, although reactive ion etching has been given as a suitable process for anisotropic etching and plasma oxidation has been given as a suitable process for forming an oxide barrier, it is not intended that these be the only processes that can be employed for anisotropic etching and oxide formation. Further, it is well know that other chemistries besides a $CF_4$ chemistry and a halogen-oxygen chemistry can be employed for non-selective and selective etch chemistries, respectively. Accordingly, it is not intended that the invention be limited to these chemistries except where specifically so claimed.

What is claimed is:

1. A method for fabricating a semiconductor device comprising:
    forming an insulator layer overlying a semiconductor substrate;
    depositing a layer of polycrystalline silicon overlying the insulator layer;
    implanting conductivity determining impurity ions into at least an upper portion of the layer of polycrystalline silicon;
    etching through the at least upper portion of the layer of polycrystalline silicon using a first anisotropic etch chemistry to expose an edge portion of the at least upper portion of the layer of polycrystalline silicon;
    forming an oxide barrier on the edge portion;
    etching a further portion of the layer of polycrystalline silicon using the first anisotropic etch chemistry; and
    etching a final portion of the layer of polycrystalline silicon using a second anisotropic etch chemistry;
    wherein etching using the first anisotropic etch chemistry comprises etching using an etch chemistry selected to etch the insulator layer and polycrystalline silicon at comparable rates and wherein etching using the second anisotropic etch chemistry comprises etching using an etch chemistry selected to etch polycrystalline silicon at a substantially higher etch rate than the etch rate of the insulator layer;
    wherein etching using the first anisotropic etch chemistry comprises etching using an etch chemistry comprising $CF_4$ and wherein etching using the second anisotropic etch chemistry comprises etching using an etch chemistry comprising a halogen and oxygen.

2. The method of claim 1 wherein the step of etching through the at least upper portion of the layer of polycrystalline silicon using the first anisotropic etch chemistry further exposes a horizontal portion of the layer of polycrystalline silicon and wherein the step of forming an oxide barrier on the edge portion further comprises forming an oxide barrier on the horizontal portion of the layer of polycrystalline silicon.

3. The method of claim 2 wherein the step of etching a further portion of the layer of polycrystalline silicon further comprises etching through the oxide barrier on the horizontal portion.

4. The method of claim 1 wherein the step of forming an oxide barrier comprises exposing the edge portion to an isotropic oxygen plasma.

5. A method for fabricating a semiconductor device comprising:
    forming an oxide layer overlying a semiconductor substrate;
    depositing a layer of polycrystalline silicon overlying the oxide layer, the layer of polycrystalline silicon having a lightly doped region and an overlying heavily doped region;
    anisotropically etching through the heavily doped region using a non-selective etch chemistry to expose an edge portion of the heavily doped region and a portion of the lightly doped region;
    forming a barrier layer on the edge portion of the heavily doped region and on the portion of the lightly doped region;
    anisotropically etching through the barrier layer on the portion of the lightly doped region using a non-selective etch chemistry; and
    anisotropically etching through the lightly doped region using a selective etch chemistry;
    wherein the step of forming the barrier layer comprises exposing the edge portion of the heavily doped region and the portion of the lightly doped region to an oxygen plasma;
    wherein the step of exposing to the oxygen plasma comprises exposing to an isotropic plasma.

6. The method of claim 5 wherein the step of anisotropically etching using the non-selective etch chemistry comprises reactive ion etching using a CF4 chemistry.

7. The method of claim 5 wherein the step of anisotropically etching using the selective etch chemistry comprises etching using a HBr and oxygen chemistry.

8. A method for fabricating a semiconductor device comprising:
   forming a gate insulator layer overlying a semiconductor substrate;
   depositing a layer of polycrystalline silicon overlying the gate insulator layer;
   implanting conductivity determining ions into at least an upper portion of the layer of polycrystalline silicon;
   forming a patterned masking layer overlying the layer of polycrystalline silicon;
   reactive ion etching through the at least an upper portion of the layer of polycrystalline silicon using a non-selective etch chemistry and using the patterned masking layer as an etch mask and leaving an unetched portion of the layer of polycrystalline silicon;
   subjecting the unetched portion of the layer of polycrystalline silicon to an oxygen plasma to form an oxide barrier layer on the unetched portion;
   reactive ion etching through the oxide barrier layer and a further portion of the layer of polycrystalline silicon using a non-selective etch chemistry and leaving a remaining portion of the layer of polycrystalline silicon;
   reactive ion etching the remaining portion of the layer of polycrystalline silicon and stopping on the gate insulator layer to form a gate electrode using a selective etch chemistry; and
   implanting conductivity determining ions into the semiconductor substrate to form source and drain regions in alignment with the gate electrode.

9. The method of claim 8 wherein the step of subjecting the unetched portion of the layer of polycrystalline silicon to an oxygen plasma comprises subjecting the unetched portion to an isotropic oxygen plasma.

10. The method of claim 8 wherein reactive ion etching using the non-selective etch chemistry comprises reactive ion etching using a $CF_4$ chemistry and wherein reactive ion etching using a selective etch chemistry comprises using a HBr and oxygen chemistry.

11. The method of claim 8 wherein forming the gate insulator layer comprises forming a gate insulator layer comprising a layer of silicon oxide and a layer of high-k dielectric material.

12. The method of claim 11 wherein depositing the layer of polycrystalline silicon comprises depositing a polycrystalline silicon layer overlying a metal layer interposed between the gate insulator layer and the polycrystalline silicon layer.

* * * * *